(12) United States Patent
Ando et al.

(10) Patent No.: US 11,557,724 B2
(45) Date of Patent: Jan. 17, 2023

(54) RESISTIVE MEMORY WITH EMBEDDED METAL OXIDE FIN FOR GRADUAL SWITCHING

(71) Applicant: INTERNATIONAL BUSINESS MACHINES CORPORATION, Armonk, NY (US)

(72) Inventors: Takashi Ando, Eastchester, NY (US); Praneet Adusumilli, Somerset, NJ (US); Jianshi Tang, Elmsford, NY (US); Reinaldo Vega, Mahopac, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 17/480,248

(22) Filed: Sep. 21, 2021

(65) Prior Publication Data
US 2022/0006009 A1 Jan. 6, 2022

Related U.S. Application Data

(62) Division of application No. 16/394,305, filed on Apr. 25, 2019, now Pat. No. 11,177,436.

(51) Int. Cl.
*H01L 45/00* (2006.01)
*H01L 27/24* (2006.01)

(52) U.S. Cl.
CPC ...... *H01L 45/1293* (2013.01); *H01L 27/2436* (2013.01); *H01L 45/10* (2013.01); *H01L 45/1233* (2013.01); *H01L 45/145* (2013.01); *H01L 45/16* (2013.01)

(58) Field of Classification Search
CPC .............. H01L 45/1233; H01L 45/124; H01L 45/145–147; H01L 45/00–1691
See application file for complete search history.

(56) References Cited

U.S. PATENT DOCUMENTS

| 8,890,109 B2 | 11/2014 | Wang et al. |
| 9,224,950 B2 | 12/2015 | Wang |
| 9,548,109 B2 | 1/2017 | Chung |
| 9,653,466 B2 | 5/2017 | Yang et al. |

(Continued)

FOREIGN PATENT DOCUMENTS

WO 2011031534 A1 3/2011

OTHER PUBLICATIONS

List of IBM Patents or Patent Applications Treated as Related dated Sep. 21, 2021, 2 pages.

(Continued)

*Primary Examiner* — Eric A. Ward
(74) *Attorney, Agent, or Firm* — Tutunjian & Bitetto, P.C.; Randy Emilio Tejeda

(57) ABSTRACT

A method is presented for enabling heat dissipation in resistive random access memory (RRAM) devices. The method includes forming a first thermal conducting layer over a bottom electrode, depositing a metal oxide liner over the first thermal conducting layer, forming a second thermal conducting layer over the metal oxide liner, recessing the second thermal conducting layer to expose the first thermal conducting layer, and forming a top electrode in direct contact with the first and second thermal conducting layers.

18 Claims, 8 Drawing Sheets

(56) References Cited

U.S. PATENT DOCUMENTS

| | | | |
|---|---|---|---|
| 9,978,939 B2 | 5/2018 | Wang et al. | |
| 2006/0197130 A1* | 9/2006 | Suh | H01L 45/148 |
| | | | 257/296 |
| 2008/0123397 A1* | 5/2008 | Liu | H01L 45/124 |
| | | | 438/102 |
| 2011/0210306 A1* | 9/2011 | Li | H01L 27/2481 |
| | | | 257/3 |
| 2011/0291064 A1* | 12/2011 | Marsh | H01L 45/1608 |
| | | | 257/E45.001 |
| 2015/0053908 A1* | 2/2015 | Fowler | H01L 45/1641 |
| | | | 257/4 |
| 2017/0222143 A1 | 8/2017 | Chang et al. | |
| 2017/0372782 A1* | 12/2017 | Gibson | H01L 45/128 |

OTHER PUBLICATIONS

Yu et al., "A Neuromorphic Visual System Using RRAM Synaptic Devices with Sub-pJ Energy and Tolerance to Variability: Experimental Characterization and Large-Scale Modeling", 2012 International Electron Devices Meeting, Dec. 2012. pp. 1-4.

Marchewka et al., "Nanoionic Resistive Switching Memories: On the Physical Nature of the Dynamic Reset Process", Advances Electronic Materials. vol. 2. Issue 1. Jan. 2016. pp. 1-13.

Fleck et al., "Uniting Gradual and Abrupt SET Processes in Resistive Switching Oxides", Physical Review Applied. vol. 6. Issue 6. Dec. 2016. pp. 1-11.

* cited by examiner

RESISTIVE MEMORY WITH EMBEDDED METAL OXIDE FIN FOR GRADUAL SWITCHING

BACKGROUND

The present invention relates generally to semiconductor devices, and more specifically, to a resistive memory device with an embedded metal oxide fin for achieving gradual switching.

Resistive random access memory (RRAM) is considered a promising technology for electronic synapse devices or memristors for neuromorphic computing as well as high-density and high-speed non-volatile memory applications. In neuromorphic computing applications, a resistive memory device can be employed as a connection (synapse) between a pre-neuron and post-neuron, representing the connection weight in the form of device resistance. Multiple pre-neurons and post-neurons can be connected through a crossbar array of RRAMs, which can express a fully-connected neural network configuration.

SUMMARY

In accordance with an embodiment, a method is provided for enabling heat dissipation in resistive random access memory (RRAM) devices. The method includes forming a first thermal conducting layer over a bottom electrode, depositing a metal oxide liner over the first thermal conducting layer, forming a second thermal conducting layer over the metal oxide liner, recessing the second thermal conducting layer to expose the first thermal conducting layer, and forming a top electrode in direct contact with the first and second thermal conducting layers.

In accordance with another embodiment, a method is provided for enabling heat dissipation in resistive random access memory (RRAM) devices. The method includes forming a thermal conducting layer over a bottom electrode, depositing a metal oxide liner over the thermal conducting layer, forming a dielectric layer over the metal oxide liner, recessing the dielectric layer to expose the thermal conducting layer, and forming a top electrode in direct contact with the thermal conducting layer and the dielectric layer.

In accordance with yet another embodiment, a semiconductor device is provided for enabling heat dissipation in resistive random access memory (RRAM) devices. The semiconductor device includes a first thermal conducting layer disposed over a bottom electrode, a metal oxide liner disposed in direct contact with the first thermal conducting layer, a second thermal conducting layer disposed in direct contact with the metal oxide liner such that the first and second thermal conducting layers are formed on opposed ends of the metal oxide liner, and a top electrode disposed in direct contact with the first and second thermal conducting layers.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE DRAWINGS

The invention will provide details in the following description of preferred embodiments with reference to the following figures wherein.

Throughout the drawings, same or similar reference numerals represent the same or similar elements.

DETAILED DESCRIPTION

Embodiments in accordance with the present invention provide methods and devices for constructing resistive random access memory (RRAM) devices, and, in particular, employing a heat dissipation layer surrounding a fin-shaped filament forming layer to achieve gradual switching in RRAM devices.

RRAMs can be employed for electronic synapse devices or memristors for neuromorphic computing as well as high-density and high-speed non-volatile memory applications. In neuromorphic computing applications, a resistive memory device can be employed as a connection (synapse) between a pre-neuron and post-neuron, representing a connection weight in the form of device resistance. Multiple pre-neurons and post-neurons can be connected through a crossbar array of RRAMs, which can be configured as a fully-connected neural network. Large scale integration of large RRAM arrays with complementary metal oxide semiconductor (CMOS) circuits can enable scaling of RRAM devices down to 10 nm and beyond for neuromorphic computing as well as high-density and high-speed non-volatile memory applications.

Hafnium oxide based RRAM devices are being explored for neuromorphic computing, particularly as synaptic elements, to achieve faster and more energy efficient vector matrix multiplications in neural networks. While RESET programming can be made gradual (thinning of the filament leading to a gradual decrease in conductivity), SET programming is usually abrupt, and, thus, limits the symmetry needed for a resistive processing unit. The primary reason for this abruptness is the acceleration of this process at elevated temperatures and the self-feeding nature of it due to the increased Joule heating as the filament becomes more conducting.

Embodiments in accordance with the present invention provide methods and devices for constructing RRAM devices with a heat dissipation element that eliminates the abruptness of the SET programming. The exemplary embodiments of the present invention employ a metal oxide fin structure ($HfO_2$) embedded in a thermal conducting layer (e.g., aluminum oxide ($Al_2O_3$)). The exemplary embodiments efficiently dissipate heat during forming and setting operations, and, thus, circumvent the self-feeding mechanism that causes the abrupt change in device resistance. Both the choice of materials and the geometric features facilitate the heat dissipation.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

Figure 1:
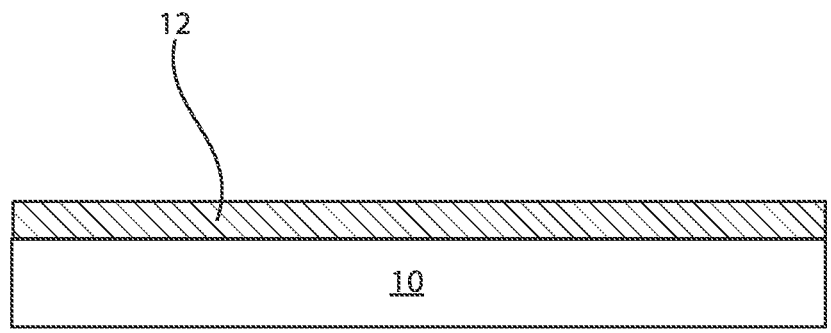
FIG. 1 is a cross-sectional view of a semiconductor structure including a bottom electrode deposited on a first inter-layer dielectric (ILD), in accordance with an embodiment of the present invention.

FIG. 1 is a cross-sectional view of a semiconductor structure including a bottom electrode deposited on a first inter-layer dielectric (ILD), in accordance with an embodiment of the present invention.

A semiconductor structure includes a bottom electrode 12 formed over an inter-layer dielectric (ILD) 10.

The ILD 10 can include any materials known in the art, such as, for example, porous silicates, carbon doped oxides, silicon dioxides, silicon nitrides, silicon oxynitrides, or other dielectric materials. The ILD 10 can be formed using any method known in the art, such as, for example, chemical vapor deposition, plasma enhanced chemical vapor deposition, atomic layer deposition, or physical vapor deposition. The ILD 10 can have a thickness ranging from about 25 nm to about 200 nm.

The bottom electrode 12 can include a conductive material, such as Cu, Al, Ag, Au, Pt, W, etc. In some embodiments, the bottom electrode 12 can include nitrides such as TiN, TaN, Ta or Ru. In a preferred embodiment, the bottom electrode 12 is titanium nitride (TiN).

Figure 2:
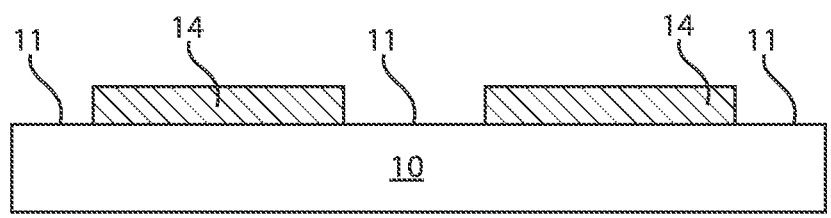
FIG. 2 is a cross-sectional view of the semiconductor structure of FIG. 1 where the bottom electrode is patterned by lithography and etching, in accordance with an embodiment of the present invention.

FIG. 2 is a cross-sectional view of the semiconductor structure of FIG. 1 where the bottom electrode is patterned by lithography and etching, in accordance with an embodiment of the present invention.

In various example embodiments, the bottom electrode 12 is patterned by lithography and etching such that bottom electrode portions 14 remain. A top surface 11 of the ILD 10 is also exposed.

Figure 3:
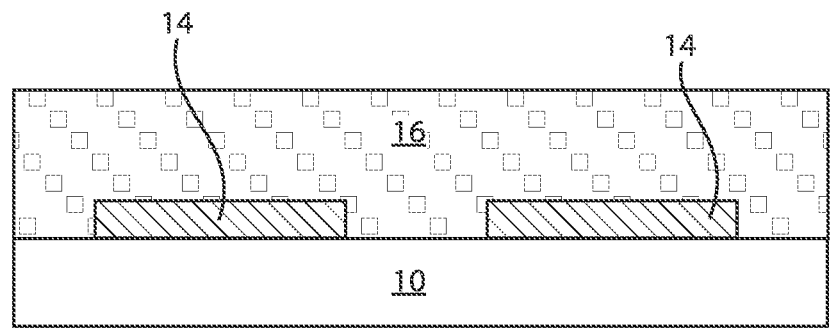
FIG. 3 is a cross-sectional view of the semiconductor structure of FIG. 2 where a first thermal conducting layer is deposited over the bottom electrode portions, in accordance with an embodiment of the present invention.

FIG. 3 is a cross-sectional view of the semiconductor structure of FIG. 2 where a first thermal conducting layer is deposited over the bottom electrode portions, in accordance with an embodiment of the present invention.

In various example embodiments, a first thermal conducting layer 16 is deposited over the bottom electrode portions 14. The first thermal conducting layer 16 can be, e.g., aluminum oxide ($Al_2O_3$). $Al_2O_3$ has a high thermal conductivity of approximately 36 W/mK and a high resistivity of at least $10^{14}$ ohm-cm.

Figure 4:
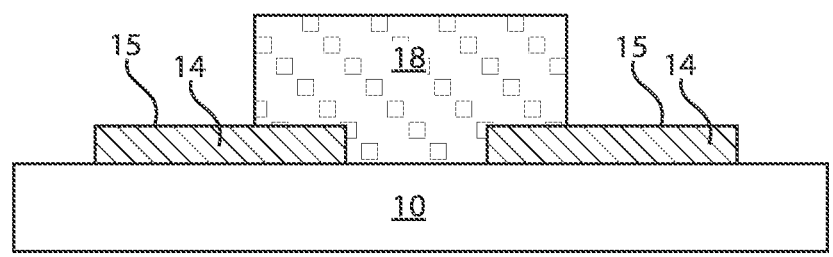
FIG. 4 is a cross-sectional view of the semiconductor structure of FIG. 3 where the thermal conducting layer is patterned into mandrels by lithography and etching, in accordance with an embodiment of the present invention.

FIG. 4 is a cross-sectional view of the semiconductor structure of FIG. 3 where the thermal conducting layer is patterned into mandrels by lithography and etching, in accordance with an embodiment of the present invention.

In various example embodiments, the thermal conducting layer 16 is patterned into mandrels 18 by lithography and etching. The mandrels 18 contact a portion of the bottom electrode portions 14. A top surface 15 of the bottom electrode portions 14 is also exposed.

Figure 5:
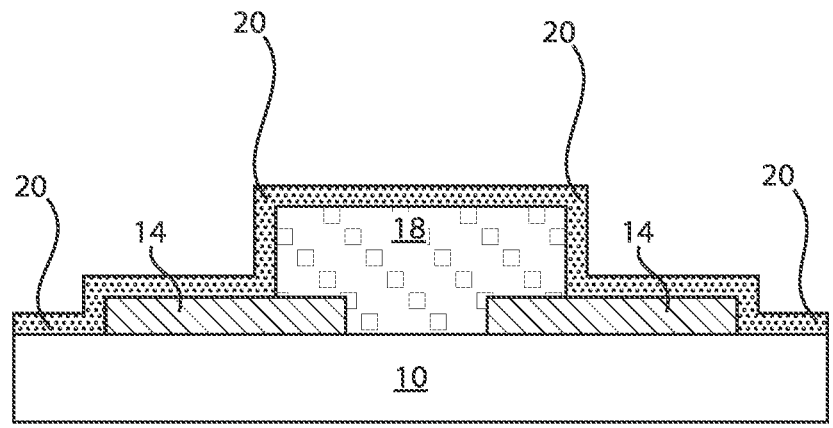
FIG. 5 is a cross-sectional view of the semiconductor structure of FIG. 4 where a metal oxide liner is deposited over the entire structure, in accordance with an embodiment of the present invention.

FIG. 5 is a cross-sectional view of the semiconductor structure of FIG. 4 where a metal oxide liner is deposited over the entire structure, in accordance with an embodiment of the present invention.

In various example embodiments, a metal oxide liner 20 is deposited over the entire structure. The metal oxide liner 20 can be, e.g., a hafnium oxide ($HfO_2$) liner.

However, the metal oxide liner 20 can be any type of high-k dielectric layer, such as, but not limited to, $HfO_2$, HfSiO, HfSiON, HfZrO, $Ta_2O_5$, $ZrO_2$, $TiO_2$, $La_2O_3$, $Y_2O_3$, $Al_2O_3$, and mixtures thereof.

Figure 6:
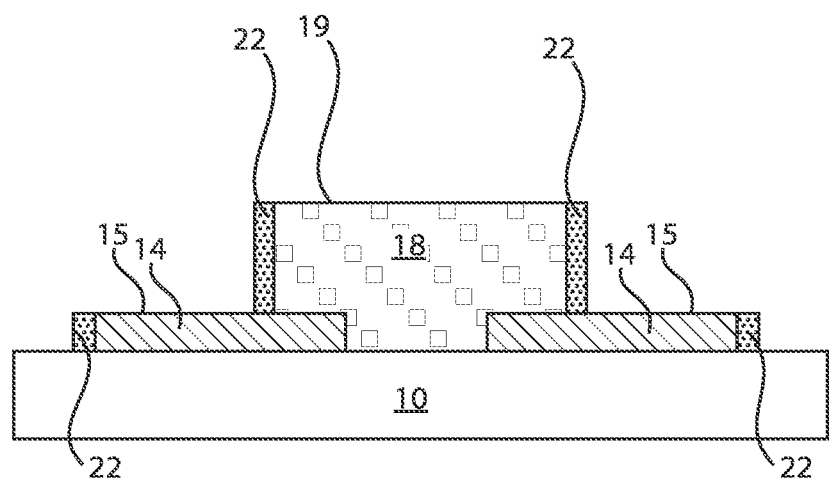
FIG. 6 is a cross-sectional view of the semiconductor structure of FIG. 5 where the metal oxide liner is etched, in accordance with another embodiment of the present invention.

FIG. 6 is a cross-sectional view of the semiconductor structure of FIG. 5 where the metal oxide liner is etched, in accordance with another embodiment of the present invention.

In another example embodiment, the metal oxide liner 20 can be etched to form metal liner portions 22. The metal liner portions 22 are formed adjacent sidewalls of the mandrels 18 and sidewalls of the bottom electrode portions 14. A top surface 19 of the mandrels 18 can also be exposed. The metal liner portions 22 are vertical segments or sections. The metal liner portions 22 are perpendicular to the bottom electrode portions 14. The metal liner portions 22 are also perpendicular to the first ILD 10.

Figure 7:
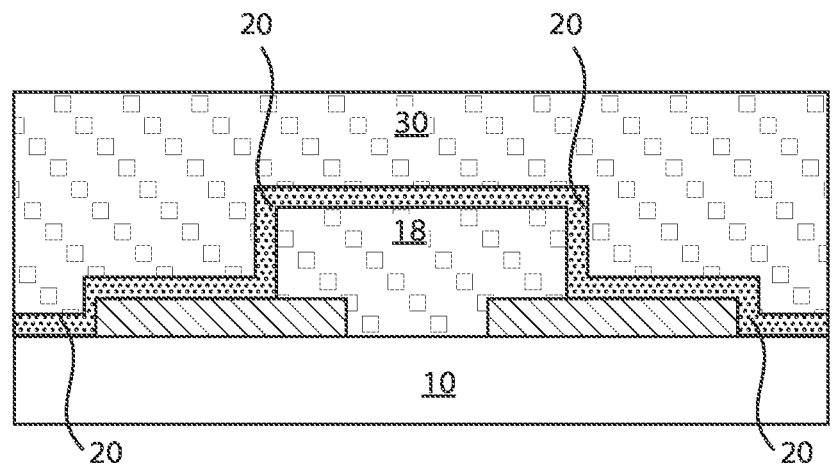
FIG. 7 is a cross-sectional view of the semiconductor structure of FIG. 5 where a second thermal conducting layer is deposited over the metal oxide liner, in accordance with another embodiment of the present invention.

FIG. 7 is a cross-sectional view of the semiconductor structure of FIG. 5 where a second thermal conducting layer is deposited over the metal oxide liner, in accordance with another embodiment of the present invention.

In various example embodiments, a second thermal conducting layer 30 is deposited over the metal oxide liner 20. The second thermal conducting layer 30 can be, e.g., aluminum oxide ($Al_2O_3$). One skilled in the art can contemplate using other thermal conducting materials.

Figure 8:
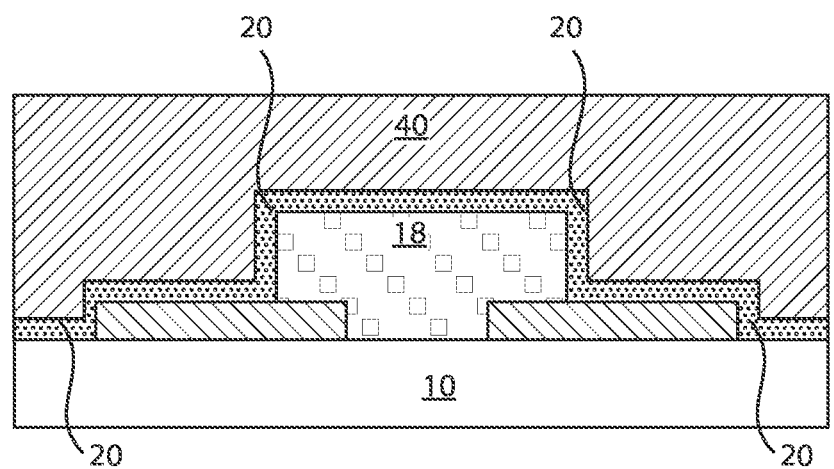
FIG. 8 is a cross-sectional view of the semiconductor structure of FIG. 5 where a dielectric layer (instead of a thermal conducting layer) is deposited over the metal oxide liner, in accordance with another embodiment of the present invention.

FIG. 8 is a cross-sectional view of the semiconductor structure of FIG. 5 where a dielectric layer (instead of a thermal conducting layer) is deposited over the metal oxide liner, in accordance with another embodiment of the present invention.

In an alternative embodiment, a dielectric layer 40 is deposited over the metal oxide liner 20 instead of a second thermal conducting layer 30. The dielectric layer 40 can be, e.g., silicon nitride ($Si_3N_4$).

Figure 9:
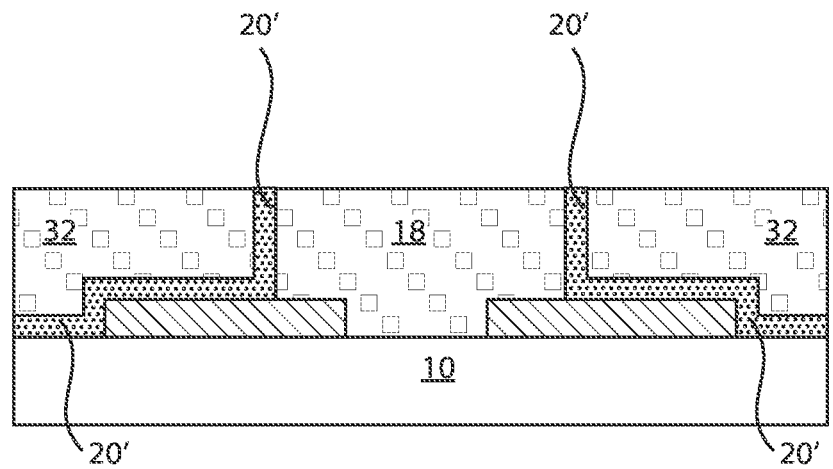
FIG. 9 is a cross-sectional view of the semiconductor structure of FIG. 7 where chemical mechanical polishing (CMP) is performed to expose a top surface of the mandrels, in accordance with an embodiment of the present invention.

FIG. 9 is a cross-sectional view of the semiconductor structure of FIG. 7 where chemical mechanical polishing (CMP) is performed to expose a top surface of the mandrels, in accordance with an embodiment of the present invention.

In various example embodiments, chemical mechanical polishing (CMP) is performed to expose a top surface of the mandrels 18. Additionally, remaining portions 32 of the second thermal conducting layer 30 are also formed. The mandrels 18 are separated from the remaining portions 32 by the metal oxide liner portions 20'. The metal oxide liner portions 20' define a stepped configuration.

Figure 10:
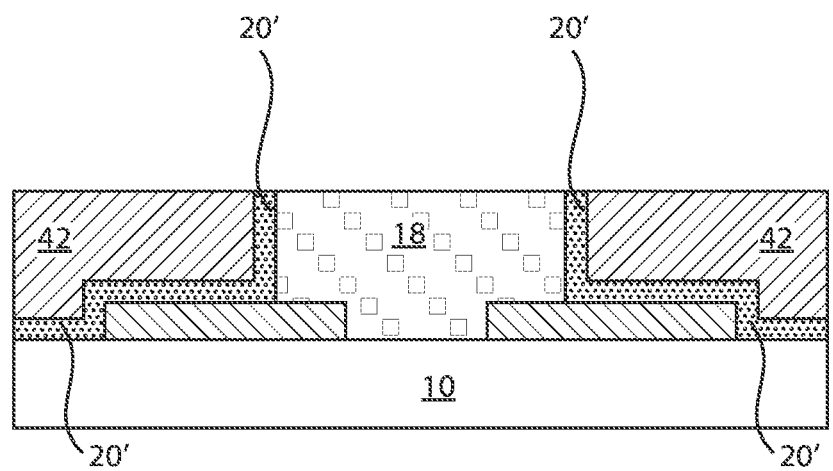
FIG. 10 is a cross-sectional view of the semiconductor structure of FIG. 8 where chemical mechanical polishing (CMP) is performed to expose a top surface of the mandrels, in accordance with an embodiment of the present invention.

FIG. 10 is a cross-sectional view of the semiconductor structure of FIG. 8 where chemical mechanical polishing (CMP) is performed to expose a top surface of the mandrels, in accordance with an embodiment of the present invention. In this case, it is easier to stop the CMP on the top surface of the mandrels 18 due to a difference of polished rates between the mandrels 18 and the dielectric layer 40.

In various example embodiments, chemical mechanical polishing (CMP) is performed to expose a top surface of the mandrels 18. Additionally, remaining portions 42 of the dielectric layer 40 are also formed. The mandrels 18 are separated from the remaining portions 42 by the metal oxide liner portions 20'.

Figure 11:
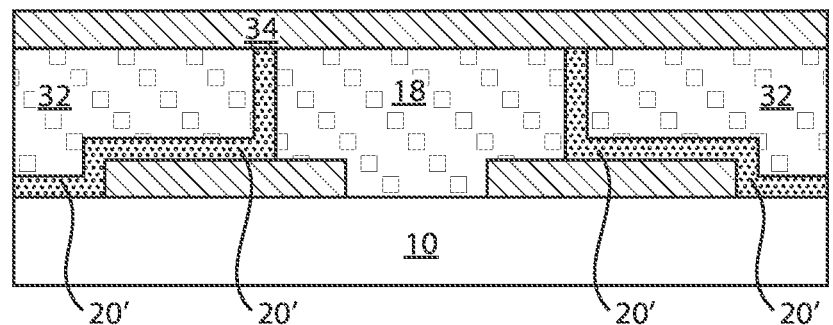
FIG. 11 is a cross-sectional view of the semiconductor structure of FIG. 9 where a top electrode is deposited, in accordance with an embodiment of the present invention.

FIG. 11 is a cross-sectional view of the semiconductor structure of FIG. 9 where a top electrode is deposited, in accordance with an embodiment of the present invention.

In various example embodiments, a top electrode 34 is deposited over the mandrels 18 and over the remaining portions 32 of the second thermal conducting layer 30.

The top electrode 34 can include a conductive material, such as Cu, Al, Ag, Au, Pt, W, etc. In some embodiments, top electrode 34 can include nitrides such as TiN, TaN, Ta or Ru. In a preferred embodiment, the top electrode 34 is titanium nitride (TiN) or an aluminum containing alloy.

Figure 12:
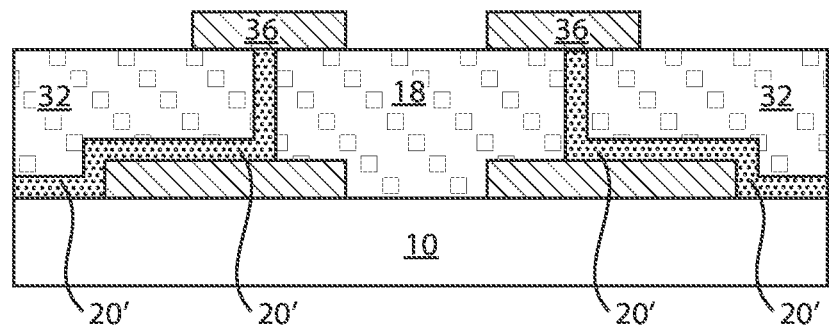
FIG. 12 is a cross-sectional view of the semiconductor structure of FIG. 11 where the top electrode is patterned by lithography and etching, in accordance with an embodiment of the present invention.

FIG. 12 is a cross-sectional view of the semiconductor structure of FIG. 11 where the top electrode is patterned by lithography and etching, in accordance with an embodiment of the present invention.

In various example embodiments, the top electrode 34 is patterned by lithography and etching such that top electrode portions 36 remain. A top surface of the mandrels 18 and the remaining portions 32 of the second thermal conducting layer 30 are also exposed.

Figure 13:
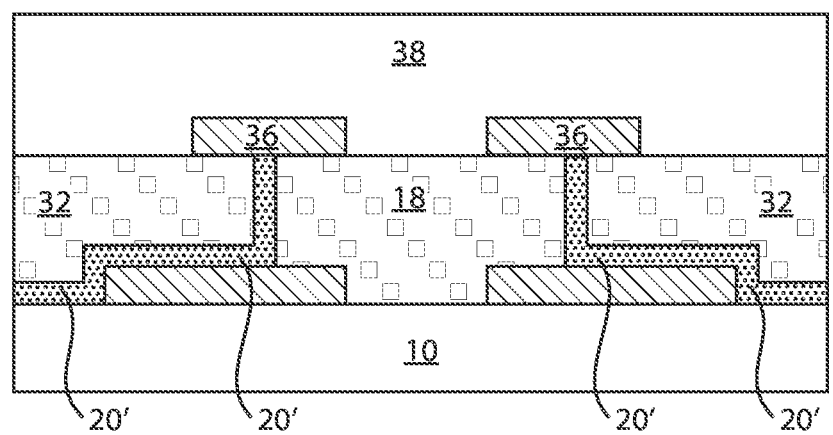
FIG. 13 is a cross-sectional view of the semiconductor structure of FIG. 12 where a second ILD layer is formed over the top electrode portions, in accordance with an embodiment of the present invention.

FIG. 13 is a cross-sectional view of the semiconductor structure of FIG. 12 where a second ILD layer is formed over the top electrode portions, in accordance with an embodiment of the present invention.

In various example embodiments, a second ILD layer 38 is formed over the top electrode portions 36.

Figure 14:
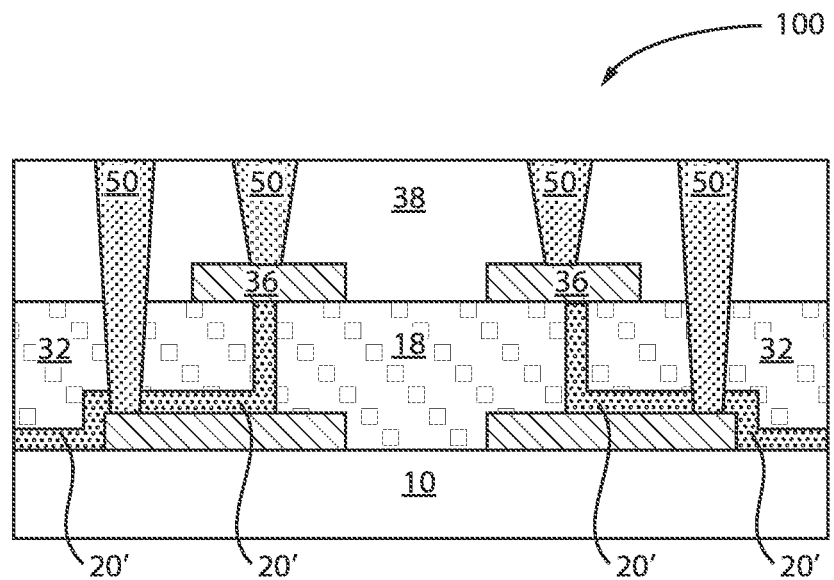
FIG. 14 is a cross-sectional view of the semiconductor structure of FIG. 13 where contacts and metallization are formed, in accordance with an embodiment of the present invention.

FIG. 14 is a cross-sectional view of the semiconductor structure of FIG. 13 where contacts and metallization are formed, in accordance with an embodiment of the present invention.

In various example embodiments, contact vias 50 are formed. A first set of contact vias 50 extend to the bottom electrode portions 14 and a second set of contact vias 50 extend to the top electrode portions 36. In the structure 100, $Al_2O_3$ remains between the top electrode portions 36 and the bottom electrode portions 14, where the metal oxide liner portions 20' directly contact the top electrode portions 36 and the bottom electrode portions 14. Additionally, the metal oxide liner portions 20' extend over the top surface of the bottom electrode portions 14 and onto the first ILD 10. The metal oxide liner portions 20' maintain a substantially stepped configuration.

In various example embodiments, the conductive material of the contact vias 50 can be metals including copper (Cu), cobalt (Co), aluminum (Al), platinum (Pt), gold (Au), tungsten (W), titanium (Ti), or any combination thereof. The metal can be deposited by a suitable deposition process, for example, chemical vapor deposition (CVD), plasma enhanced chemical vapor deposition (PECVD), physical vapor deposition (PVD), plating, thermal or e-beam evaporation, or sputtering.

In various exemplary embodiments, the height of the conductive material can be reduced by chemical-mechanical polishing (CMP) and/or etching. Therefore, the planarization process can be provided by CMP. Other planarization process can include grinding and polishing.

Figure 15:
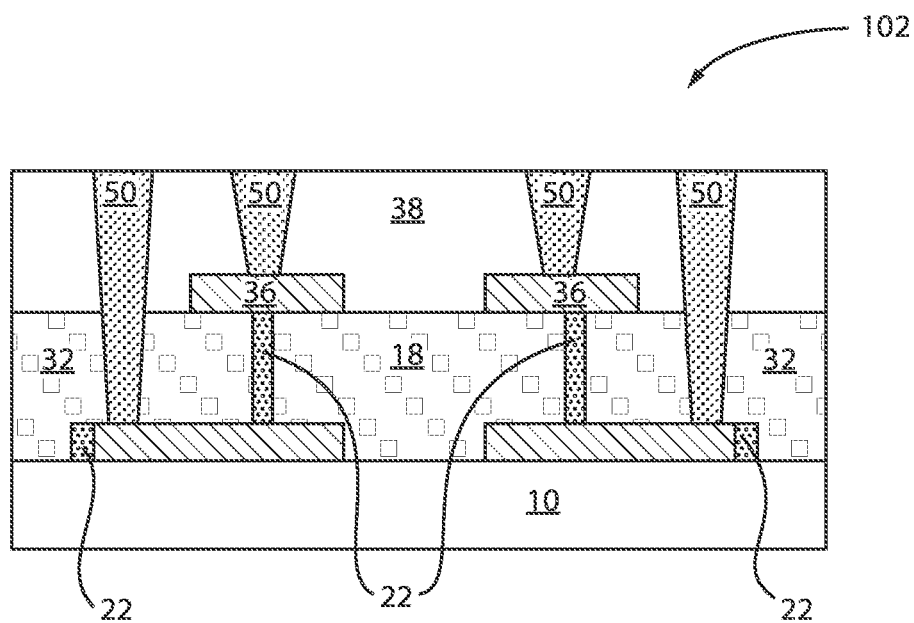
FIG. 15 is a cross-sectional view based on the semiconductor structure of FIG. 6 where contacts and metallization are formed, in accordance with another embodiment of the present invention.

FIG. 15 is a cross-sectional view based on the semiconductor structure of FIG. 6 where contacts and metallization are formed, in accordance with another embodiment of the present invention.

In accordance with another embodiment, contact vias 50 are formed based on the structure of FIG. 6 where the metal oxide liner 20 was etched to form metal liner portions 22. When the same process is followed with metal liner portions 22, the structure 102 is achieved.

In the structure 102, $Al_2O_3$ remains between the top electrode portions 36 and the bottom electrode portions 14, where the metal oxide liner portions 22 directly contact the top electrode portions 36 and the bottom electrode portions 14. However, unlike FIG. 14, the metal oxide liner portions 22 do not extend over the top surface of the bottom electrode portions 14 and onto the first ILD 10. Instead, the metal oxide liner portions 22 are vertical sections that are disconnected or separate and distinct from each other.

Figure 16:
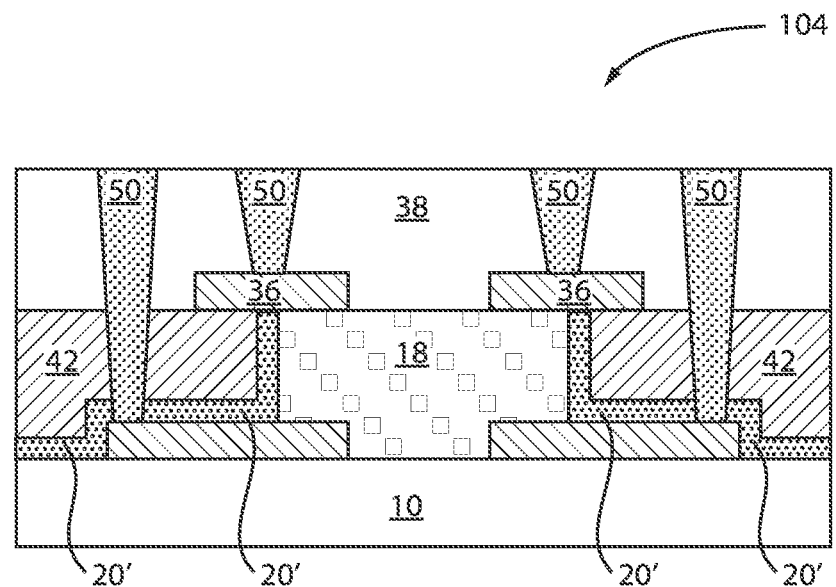
FIG. 16 is a cross-sectional view based on the semiconductor structure of FIG. 10 where contacts and metallization are subsequently formed, in accordance with another embodiment of the present invention.

FIG. 16 is a cross-sectional view based on the semiconductor structure of FIG. 10 where contacts and metallization are subsequently formed, in accordance with another embodiment of the present invention.

In accordance with another embodiment, contact vias 50 are formed based on the structure of FIG. 10 where remaining portions 42 of the dielectric layer 40 are present. When the same process is followed with the dielectric layer portions 40, the structure 104 is achieved.

In the structure 104, both $Al_2O_3$ and $Si_3N_4$ remain between the top electrode portions 36 and the bottom electrode portions 14, as opposed to the structure 100 where only $Al_2O_3$ remains between the top electrode portions 36 and the bottom electrode portions 14. Moreover, the metal oxide liner portions 20' directly contact the top electrode portions 36 and the bottom electrode portions 14. Additionally, the metal oxide liner portions 20' extend over the top surface of the bottom electrode portions 14 and onto the first ILD 10. The metal oxide liner portions 20' contact both the $Al_2O_3$ and $Si_3N_4$ regions. The metal oxide liner portions 20' maintain a substantially stepped configuration.

Figure 17:
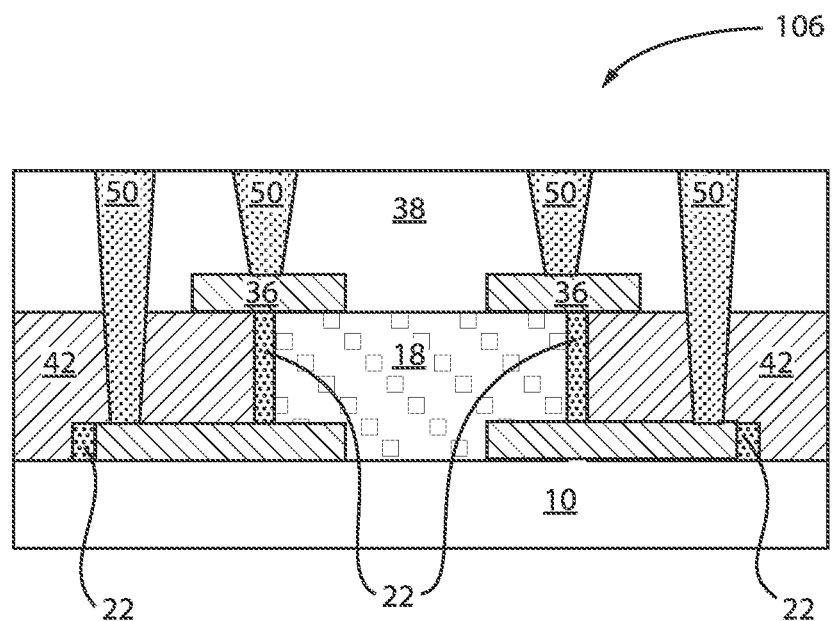
FIG. 17 is a cross-sectional view based on the semiconductor structures of FIGS. 6 and 8 where contacts and metallization are subsequently formed, in accordance with another embodiment of the present invention.

FIG. 17 is a cross-sectional view based on the semiconductor structures of FIGS. 6 and 8 where contacts and metallization are subsequently formed, in accordance with another embodiment of the present invention.

In accordance with another embodiment, contact vias 50 are formed based on the structure of FIGS. 6 and 8 where the metal oxide liner 20 was etched to form metal liner portions 22 and where both $Al_2O_3$ and $Si_3N_4$ remain between the top electrode portions 36 and the bottom electrode portions 14. When the same process is followed with metal liner portions 22 and both $Al_2O_3$ and $Si_3N_4$ regions remain between the top electrode portions 36 and the bottom electrode portions 14, the structure 106 is achieved.

In the structure 106, both $Al_2O_3$ and $Si_3N_4$ remain between the top electrode portions 36 and the bottom electrode portions 14, where the metal oxide liner portions 22 directly contact the top electrode portions 36 and the bottom electrode portions 14. However, unlike FIG. 16, the metal oxide liner portions 22 do not extend over the top surface of the bottom electrode portions 14 and onto the first ILD 10. Instead, the metal oxide liner portions 22 are vertical sections that are disconnected or separate and distinct from each other. Some of the metal oxide liner portions 22 contact both the $Al_2O_3$ and $Si_3N_4$ regions, whereas some of the metal oxide liner portions 22 only contact the $Si_3N_4$ regions.

All four structures 100, 102, 104, 106 enable transport of Joule heat away from the filament to control the filament thickening process or SET. All four structures 100, 102, 104, 106 include a heat dissipation layer that surrounds a fin-shaped filament forming layer in order to achieve gradual switching. Stated differently, the exemplary embodiments employ a metal oxide fin structure ($HfO_2$) embedded in a thermal conducting layer ($Al_2O_3$). The exemplary embodiments efficiently dissipate heat during forming and setting operations, and, thus, circumvent the self-feeding mechanism that causes the abrupt change in device resistance. Both the choice of materials and the geometric features facilitate the heat dissipation. In particular, a ReRAM structure with hafnium oxide fin embedded in a higher thermal conductivity ($Al_2O_3$) dielectric layer can achieve the desired results.

In summary, $HfO_2$ fins are defined as sidewall liners of $Al_2O_3$ mandrels, the filament is confined within the $HfO_2$ deposited thickness (e.g., 2-4 nm), thus facilitating heat diffusion to $Al_2O_3$. The $HfO_2$ fin structure (e.g., width 4 nm and length 25 nm=100 $nm^2$) secures sufficient total area of $HfO_2$ and enables the electroforming process.

Regarding FIGS. 1-17, deposition is any process that grows, coats, or otherwise transfers a material onto the wafer. Available technologies include, but are not limited to, thermal oxidation, physical vapor deposition (PVD), chemical vapor deposition (CVD), electrochemical deposition (ECD), molecular beam epitaxy (MBE) and more recently, atomic layer deposition (ALD) among others. As used herein, "depositing" can include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

The term "processing" as used herein includes deposition of material or photoresist, patterning, exposure, development, etching, cleaning, stripping, implanting, doping, stressing, layering, and/or removal of the material or photoresist as needed in forming a described structure.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which include multiple copies of the chip design in question that are to be formed on a wafer. The photolithographic masks are utilized to define areas of the wafer to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys. Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a method for employing a heat dissipation layer surrounding a fin-shaped filament forming layer to achieve gradual switching (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A semiconductor structure for enabling heat dissipation in resistive random access memory (RRAM) devices, the semiconductor structure comprising:
   a first thermal conducting layer disposed in direct contact with a top surface of a bottom electrode;
   a metal oxide liner disposed in direct contact with the first thermal conducting layer and with sidewalls of the bottom electrode;
   a second thermal conducting layer disposed in direct contact with the metal oxide liner such that the first and second thermal conducting layers are formed on opposed ends of the metal oxide liner; and
   a top electrode disposed in direct contact with the first and second thermal conducting layers.

2. The semiconductor structure of claim 1, wherein the first and second thermal conducting layers are aluminum oxide ($Al_2O_3$) layers and the metal oxide liner is a hafnium oxide ($HfO_2$) liner.

3. The semiconductor structure of claim 1, wherein the metal oxide liner directly contacts a portion of a top surface of the bottom electrode.

4. The semiconductor structure of claim 1, wherein the metal oxide liner separates the first thermal conducting layer from the second thermal conducting layer.

5. The semiconductor structure of claim 1, wherein the metal oxide liner directly contacts the top and bottom electrodes.

6. The semiconductor structure of claim 1, wherein metal oxide liner defines a stepped configuration.

7. The semiconductor structure of claim 1, wherein a first set of contacts extends to the bottom electrode and a second set of contacts extends to the top electrode.

8. The semiconductor structure of claim 1, wherein a first set of contacts directly contacts only a top surface of the bottom electrode and directly contacts sidewalls of the metal oxide liner.

9. The semiconductor structure of claim 1, wherein a first set of contacts extend through the metal oxide liner.

10. A semiconductor structure for enabling heat dissipation in resistive random access memory (RRAM) devices, the semiconductor structure comprising:
- a thermal conducting layer disposed in direct contact with a top surface of a bottom electrode;
- a metal oxide liner disposed in direct contact with the thermal conducting layer and with sidewalls of the bottom electrode;
- a dielectric layer disposed in direct contact with the metal oxide liner such that the thermal conducting layer and the dielectric layer are formed on opposed ends of the metal oxide liner; and
- a top electrode disposed in direct contact with the thermal conducting layer and the dielectric layer.

11. The semiconductor structure of claim 10, wherein the thermal conducting layer is an aluminum oxide ($Al_2O_3$) layer and the metal oxide liner is a hafnium oxide ($HfO_2$) liner.

12. The semiconductor structure of claim 10, wherein the metal oxide liner directly contacts a portion of a top surface of the bottom electrode.

13. The semiconductor structure of claim 10, wherein the metal oxide liner separates the thermal conducting layer from the dielectric layer.

14. The semiconductor structure of claim 10, wherein the metal oxide liner directly contacts the top and bottom electrodes.

15. The semiconductor structure of claim 10, wherein metal oxide liner defines a stepped configuration.

16. The semiconductor structure of claim 10, wherein a first set of contacts extends to the bottom electrode and a second set of contacts extends to the top electrode.

17. The semiconductor structure of claim 10, wherein a first set of contacts directly contacts only a top surface of the bottom electrode and directly contacts sidewalls of the metal oxide liner.

18. The semiconductor structure of claim 10, wherein a first set of contacts extend through the metal oxide liner.

* * * * *